United States Patent
Xu et al.

(10) Patent No.: US 10,424,482 B2
(45) Date of Patent: Sep. 24, 2019

(54) METHODS AND STRUCTURES FOR FORMING A TIGHT PITCH STRUCTURE

(71) Applicant: International Business Machines Corporation, Armonk, NY (US)

(72) Inventors: Peng Xu, Santa Clara, CA (US); Kangguo Cheng, Schenectady, NY (US); Choonghyun Lee, Rensselaer, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/846,779

(22) Filed: Dec. 19, 2017

(65) Prior Publication Data

US 2019/0189443 A1 Jun. 20, 2019

(51) Int. Cl.
*H01L 21/033* (2006.01)
*H01L 27/12* (2006.01)
(Continued)

(52) U.S. Cl.
CPC .... *H01L 21/0332* (2013.01); *H01L 21/02164* (2013.01); *H01L 21/02255* (2013.01); *H01L 21/02296* (2013.01); *H01L 21/02381* (2013.01); *H01L 21/02532* (2013.01); *H01L 21/02592* (2013.01); *H01L 21/02664* (2013.01); *H01L 21/02694* (2013.01); *H01L 21/0337* (2013.01); *H01L 21/0338* (2013.01); *H01L 27/1285* (2013.01); *H01L 29/6653* (2013.01); *H01L 29/6656* (2013.01); *H01L 45/1691* (2013.01);
(Continued)

(58) Field of Classification Search
None
See application file for complete search history.

(56) References Cited

U.S. PATENT DOCUMENTS 6,974,729 B2 12/2005 Collaert et al.
7,709,277 B2 5/2010 Lee et al.
(Continued)

OTHER PUBLICATIONS

E. Chong et al., "Hard Mask Profile and Loading Issue Study in SADP Process," China Semiconductor Technology International Conference (CSTIC), Mar. 15-16, 2015, 3 pages.

*Primary Examiner* — Stephanie P Duclair
(74) *Attorney, Agent, or Firm* — Vazken Alexanian; Ryan, Mason & Lewis, LLP (57) ABSTRACT

A method for manufacturing a semiconductor device includes forming a plurality of amorphous silicon germanium (a-SiGe) structures having a first percentage of germanium on a substrate, forming a plurality of spacers on sides of the plurality of a-SiGe structures, performing an annealing to convert a portion of each of the a-SiGe structures into respective portions comprising a-SiGe having a second percentage of germanium higher than the first percentage of germanium, and to convert each of the spacers into respective silicon oxide portions, removing from the substrate at least one of: one or more unconverted portions of the a-SiGe structures having the first percentage of germanium, one or more of the converted portions of a-SiGe structures, and one or more of the silicon oxide portions, and transferring a pattern to the substrate to form a plurality of patterned substrate portions, wherein the pattern includes the portions remaining after the removing.

16 Claims, 9 Drawing Sheets

(51) Int. Cl.
  *H01L 29/66* (2006.01)
  *H01L 45/00* (2006.01)
  *H01L 21/02* (2006.01)
  *H01L 21/308* (2006.01)
  *H01L 21/311* (2006.01)

(52) U.S. Cl.
  CPC ...... *H01L 21/3081* (2013.01); *H01L 21/3086* (2013.01); *H01L 21/3088* (2013.01); *H01L 21/31144* (2013.01)

(56) References Cited

U.S. PATENT DOCUMENTS

| | | | |
|---|---|---|---|
| 8,716,156 B1 | 5/2014 | Pawlak et al. | |
| 9,219,005 B2 | 12/2015 | Or-Bach et al. | |
| 9,276,013 B1 * | 3/2016 | Doris | H01L 27/1211 |
| 9,312,183 B1 | 4/2016 | Kim et al. | |
| 2005/0020020 A1 | 1/2005 | Collaert et al. | |
| 2005/0169096 A1 | 8/2005 | Lee et al. | |
| 2013/0020707 A1 | 1/2013 | Or-Bach et al. | |
| 2014/0264755 A1 * | 9/2014 | Basker | H01L 29/1054 257/616 |
| 2014/0374838 A1 | 12/2014 | Chen et al. | |
| 2016/0086796 A1 * | 3/2016 | Chan | H01L 29/785 257/347 |
| 2016/0322501 A1 * | 11/2016 | Cheng | H01L 29/7851 |
| 2016/0336236 A1 | 11/2016 | Chen et al. | |
| 2016/0365286 A1 * | 12/2016 | Basker | H01L 21/82341 |
| 2017/0005180 A1 | 1/2017 | Cheng et al. | |

\* cited by examiner

METHODS AND STRUCTURES FOR FORMING A TIGHT PITCH STRUCTURE

TECHNICAL FIELD

The field generally relates to semiconductor devices and methods of manufacturing same and, in particular, to techniques where dielectric material is used to form tight pitch structures.

BACKGROUND

Semiconductor devices, such as, for example, complementary metal-oxide semiconductor (CMOS) devices are continuously being scaled down to smaller dimensions. As components are scaled down and devices are being formed closer together, improved processing for forming tight pitch structures are needed. Self-aligned multiple-patterning (SAMP), including, but not necessarily limited to, self-aligned double patterning (SADP), self-aligned quadruple patterning (SAQP) and self-aligned octuple patterning (SAOP), has been widely used to form tight pitch structures.

However, when using these SAMP techniques, it is difficult to achieve precisely formed lines in a tight pitch structure without compromising the structure and/or integrity of adjacent lines.

SUMMARY

According to an exemplary embodiment of the present invention, a method for manufacturing a semiconductor device includes forming a plurality of mandrels on a substrate, wherein the plurality of mandrels comprise silicon germanium (SiGe) having a first percentage of germanium, forming a plurality of dielectric portions on the substrate on sides of the plurality of mandrels, performing an annealing to convert a portion of each of the plurality of mandrels into respective portions comprising SiGe having a second percentage of germanium higher than the first percentage of germanium, and to convert at least a portion of each of the plurality of dielectric portions into respective silicon oxide portions, removing from the substrate at least one of: one or more unconverted portions of the plurality of mandrels comprising SiGe having the first percentage of germanium, one or more of the converted portions of the plurality of mandrels comprising SiGe having the second percentage of germanium, and one or more of the silicon oxide portions, and transferring a pattern to the substrate to form a plurality of patterned substrate portions, wherein the pattern includes at least one of the unconverted portions of the plurality of mandrels, the converted portions of the plurality of mandrels, and the silicon oxide portions remaining after the removing.

According to an exemplary embodiment of the present invention, a method for manufacturing a semiconductor device includes forming a plurality of mandrels on a substrate, wherein the plurality of mandrels have a first percentage of a semiconductor material, forming a plurality of dielectric portions on the substrate on sides of the plurality of mandrels, performing an annealing to convert a portion of each of the plurality of mandrels into respective portions having a second percentage of the semiconductor material higher than the first percentage of the semiconductor material, and to convert at least a portion of each of the plurality of dielectric portions into respective oxide portions, removing from the substrate at least one of: one or more unconverted portions of the plurality of mandrels having the first percentage of the semiconductor material, one or more of the converted portions of the plurality of mandrels having the second percentage of the semiconductor material, and one or more of the oxide portions, and transferring a pattern to the substrate to form a plurality of patterned substrate portions, wherein the pattern includes at least one of the unconverted portions of the plurality of mandrels, the converted portions of the plurality of mandrels, and the oxide portions remaining after the removing.

According to an exemplary embodiment of the present invention, a method for manufacturing a semiconductor device includes forming a plurality of amorphous silicon germanium (a-SiGe) structures having a first percentage of germanium on a substrate, forming a plurality of spacers on the substrate on sides of the plurality of a-SiGe structures, performing an annealing to convert a portion of each of the plurality of a-SiGe structures into respective portions comprising a-SiGe having a second percentage of germanium higher than the first percentage of germanium, and to convert each of the plurality of spacers into respective silicon oxide portions, removing from the substrate at least one of: one or more unconverted portions of the plurality of a-SiGe structures having the first percentage of germanium, one or more of the converted portions of the plurality of a-SiGe structures having the second percentage of germanium, and one or more of the silicon oxide portions, and transferring a pattern to the substrate to form a plurality of patterned substrate portions, wherein the pattern includes at least one of the unconverted portions of the plurality of a-SiGe structures, the converted portions of the plurality of a-SiGe structures, and the silicon oxide portions remaining after the removing.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to using dielectric material layers and annealing to form tight pitch structures in a substrate.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET CMOS and/or, MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with embodiments of the present invention, germanium dioxide ($GeO_2$) spacers and/or layers on amorphous silicon germanium (a-SiGe) mandrels are subjected to an annealing process to form high Ge % SiGe, low Ge % SiGe and silicon oxide portions, which can be patterned and transferred to a substrate to form lines in a tight pitch structure.

The embodiments of the present invention use SAMP, such as SADP, self-aligned triple patterning (SATP) and SAQP, to form different spacer materials. Patterns of the different spacer materials can be transferred to a substrate to pattern a portion of the substrate into lines at a close pitch with respect to each other. In embodiments described herein, the processing forms "lines" in a tight pitch structure without compromising the structure and/or integrity of adjacent lines. Depending on the material of the substrate, and, therefore, the resulting material of the lines, the lines can form, for example, semiconductor fins or other semiconductor structures at a close pitch with respect to each other. Alternatively, if the substrate is a dielectric material, the lines may form isolation regions or other insulating structures for a semiconductor device at a close pitch with respect to each other. The close (or tight) pitch can be for example, 20 nm to 60 nm between adjacent lines.

Alternatively, according to an embodiment of the present invention, portions of the substrate under the different spacer materials can be removed to form openings (also referred to herein as spaces) in the substrate in a tight pitch structure without compromising the structure and/or integrity of adjacent openings. Depending on the fill material of the openings and the material of the substrate, the openings can be formed into, for example, conductive vias or other conductive or contact structures at a close pitch with respect to each other. In the case of forming conductive or contact structures, the fill material of the spaces can be, for example, copper, aluminum, cobalt or other electrically conductive material, and the substrate can be a dielectric material. Alternatively, if the substrate is a semiconductor material, the openings can be filled with a dielectric material to form isolation regions or other insulating structures at a close pitch with respect to each other for a semiconductor device. The close (or tight) pitch can be for example, 20 nm to 60 nm between adjacent openings.

Figure 1:
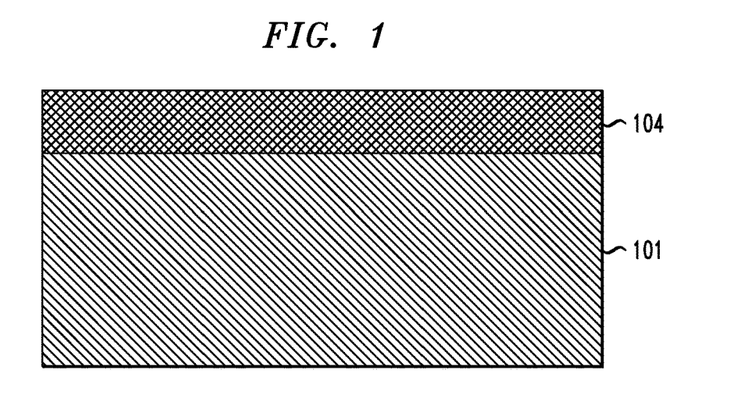
FIG. 1 is a cross-sectional view illustrating mandrel material deposition on a substrate in a method of manufacturing a semiconductor device, according to an exemplary embodiment of the present invention.
Figure 2:
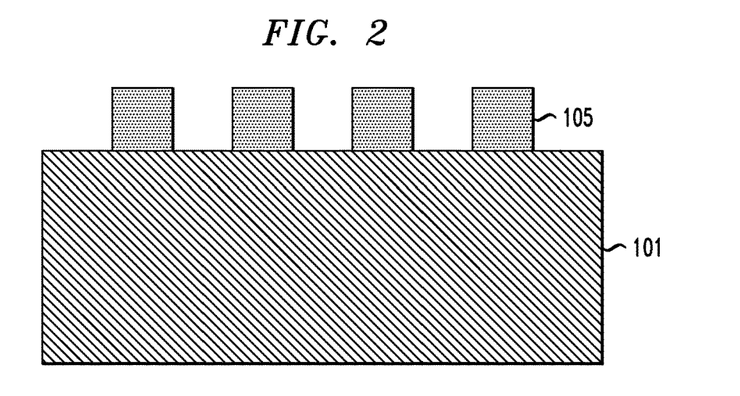
FIG. 2 is a cross-sectional view illustrating mandrel patterning on the substrate in a method of manufacturing a semiconductor device, according to an exemplary embodiment of the present invention.
Figure 3:
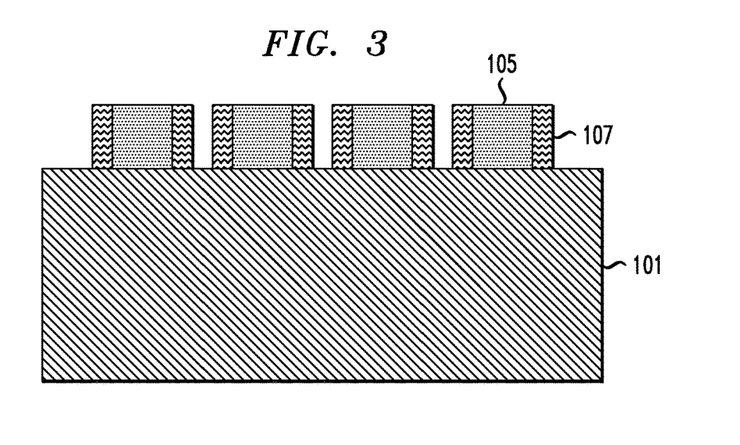
FIG. 3 is a cross-sectional view illustrating spacer formation in a method of manufacturing a semiconductor device, according to an exemplary embodiment of the present invention.

FIGS. 1-3 are cross-sectional views illustrating mandrel material deposition, mandrel patterning and spacer formation on a substrate in a method of manufacturing a semiconductor device, according to an exemplary embodiment of the present invention. Referring to FIGS. 1-3, a mandrel material layer 104 comprising amorphous silicon germanium (a-SiGe) is deposited on a substrate 101. The mandrel material layer 104 can be deposited using deposition techniques, such as, for example, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. Alternative mandrel materials can include, but are not necessarily limited to, polycrystalline silicon germanium, polycrystalline germanium, and amorphous germanium.

Referring to FIG. 2, a plurality of mandrels 105 are patterned on the substrate 101. The mandrel patterning can be done by various patterning techniques, including, but not necessarily limited to, lithography patterning followed by directional etching and/or a sidewall image transfer (SIT) process, for example. In some embodiments, the process includes using lithography followed by directional etching (e.g., reactive ion etch (ME)) to form a mandrel 105. After the mandrel formation, a conformal film can be deposited and then followed by an etchback process (e.g., RIE). As shown in FIG. 3, the conformal film will form spacers 107 at both sides of each mandrel 105. The spacer material can include, but is not necessarily limited to, germanium dioxide ($GeO_2$), which can be deposited by low-pressure chemical vapor deposition (LPCVD), plasma enhanced chemical vapor deposition (PECVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, and/or limited reaction processing CVD (LRPCVD). A height of the mandrels 105 and corresponding spacers 107 can be in the range of, but is not necessarily limited to, 30 nm to 100 nm. A horizontal width (thickness) of the spacers 107 can be in the range of, but is not necessarily limited to, 10 nm to 50 nm.

Depending on the application, the substrate 101 can include different materials. For example, in accordance with an embodiment of the present invention, the substrate 101 is formed of a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. Alternatively, the substrate 101 includes a dielectric material such as, but not necessarily limited to, low-k dielectric materials, such as, for example, a silicon oxycarbide, like SiOCH or any suitable dielectric. In some embodiments, the substrate 101 includes other device structures (not shown) such as transistors, isolation structures (such as shallow trench isolations), contacts, conducting wires, etc. In some embodiments, the substrate 101 includes both semiconductor materials and dielectric materials, for example, a layer of dielectric material on top of a layer of semiconductor material.

Figure 4:
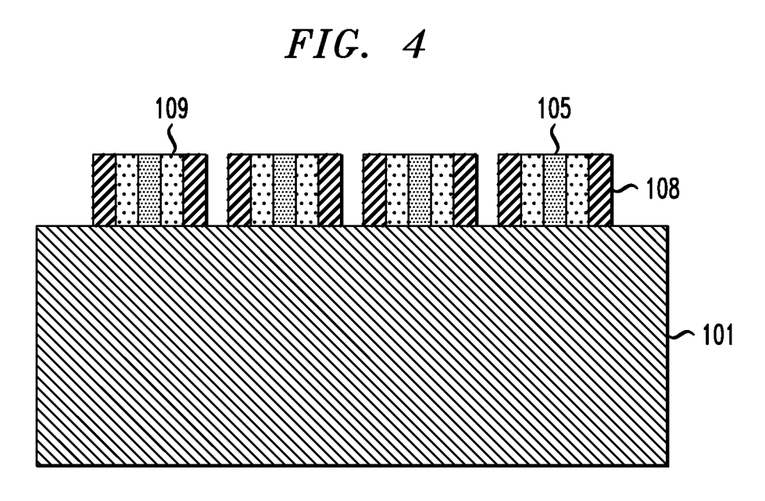
FIG. 4 is a cross-sectional view illustrating a result of an annealing process in a method of manufacturing a semiconductor device, according to an exemplary embodiment of the present invention.

FIG. 4 is a cross-sectional view illustrating a result of an annealing process in a method of manufacturing a semiconductor device, according to an exemplary embodiment of the present invention. Referring to FIG. 4, a low temperature annealing process is performed to convert the germanium dioxide ($GeO_2$) spacers 107 and convert portions of the a-SiGe mandrels 105 into silicon oxide, such as, but not necessarily limited to, silicon dioxide ($SiO_2$) or $SiO_x$, where x is for example, 1.99 or 2.01, and high germanium (Ge) percentage (%) SiGe, respectively.

According to an embodiment of the present invention, during the low temperature annealing process, the annealing conditions cause the Si in the a-SiGe mandrel 105 to bond with the oxygen in the $GeO_2$ spacers 107 to form silicon oxide portions 108. The Si in the a-SiGe mandrel does not bond with the Ge in the $GeO_2$ spacers 107. As a result, the Ge from the $GeO_2$ spacers 107 is driven into the outer portions of the mandrels 105 and the Si from the outer portions of the mandrels 105 is driven out of the mandrel portions 105 to bond with the oxygen, which forms the high Ge % SiGe portions 109 between the remaining mandrel portions 105 and the silicon oxide portions 108. The resulting Ge concentration in the high Ge % SiGe portions 109 is higher than the Ge concentration in the remaining mandrel portions 105 (also referred to herein as low Ge % SiGe portions). In accordance with an embodiment of the present invention, the percentage (i.e., concentration) of Ge in the high Ge % SiGe portions 109 is in the range of 30 atomic-90 atomic %, and the percentage (i.e., concentration) of Ge in the low Ge % SiGe portions 105 is in the range of 15 atomic %-50 atomic %.

In accordance with embodiments of the present invention, the annealing can be performed at a temperature range of 350° C.-700° C., in an environment including nitrogen, argon, xenon, helium, hydrogen, or any suitable combination of those gases, for a time period 1 millisecond to 30 minutes. The anneal can be done by rapid thermal annealing (RTP), furnace annealing, flash annealing, laser annealing, spike annealing, or any suitable combination of those techniques.

In accordance with an embodiment of the present invention, the annealing may be carried out for a variable period of time. In one example, the annealing process is carried out for a time period from about 0.5 seconds to 2 seconds, depending on temperature and germanium concentration in the SiGe mandrel. The annealing process may be carried out at a single targeted temperature, or at various ramp and soak cycles using various ramp rates and soak times.

As can be seen by the difference in size of the mandrel portion from FIG. 3 to FIG. 4, the silicon from the surface of the a-SiGe mandrel is consumed, and forms silicon oxide portions 108 and high Ge % SiGe portions 109 on outer edges of the remaining mandrel portions 105. By way of further explanation, in accordance with an embodiment of the present invention, the Si atoms in the a-SiGe mandrels 105 bond with available oxygen from the $GeO_2$ spacers 107 during the annealing process to form silicon oxide portions 108. The high Ge % SiGe portions 109 are formed due to the lower Si concentration and higher Ge concentration caused by the consumption of silicon and influx of germanium in the high Ge % SiGe portions 109.

Figure 5:
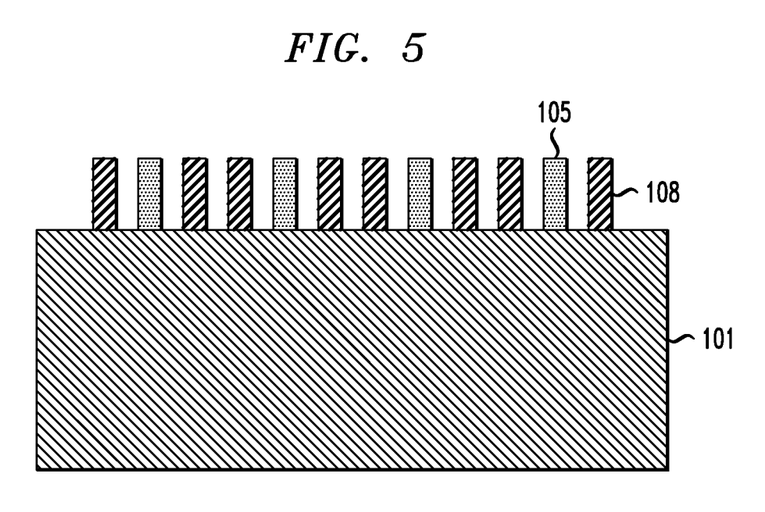
FIG. 5 is a cross-sectional view illustrating selective removal of high germanium (Ge) percentage (%) silicon germanium (SiGe) in a method of manufacturing a semiconductor device, according to an exemplary embodiment of the present invention.

FIG. 5 is a cross-sectional view illustrating selective removal of high Ge % SiGe in a method of manufacturing a semiconductor device, according to an exemplary embodiment of the present invention. Referring to FIG. 5, the high Ge % SiGe portions 109 are selectively removed with respect to the remaining mandrel portions 105 and the silicon oxide portions 108. An etching process that selectively removes the high Ge % SiGe portions 109 with respect to the remaining mandrel portions 105 and the silicon oxide portions 108 is performed. The selective removal can be performed using, for example, gas phase hydrogen fluoride or a wet etch process containing a mix of ammonia and hydrogen peroxide, and is performed down to the substrate 101.

Figure 6:
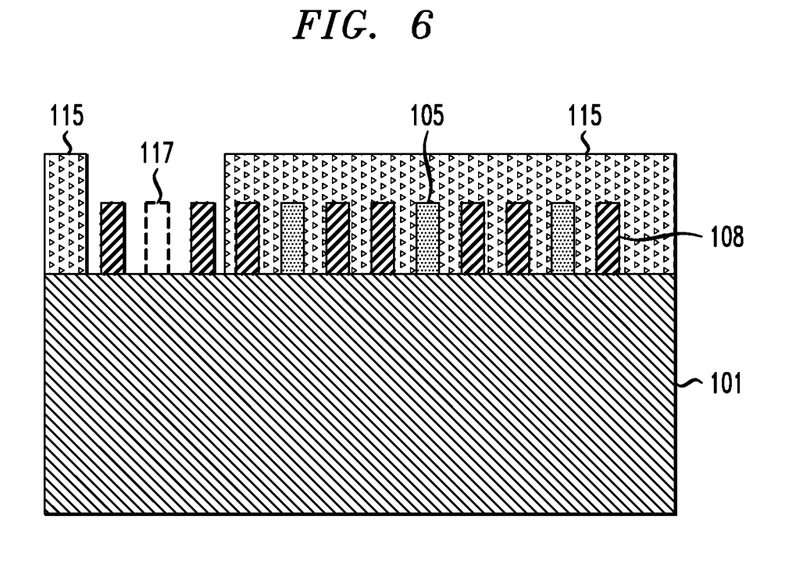
FIG. 6 is a cross-sectional view illustrating mask formation and selective removal of an exposed portion of the mandrel material in a method of manufacturing a semiconductor device, according to an exemplary embodiment of the present invention.

FIG. 6 is a cross-sectional view illustrating mask formation and selective removal of an exposed portion of the mandrel material in a method of manufacturing a semiconductor device, according to an exemplary embodiment of the present invention. Referring to FIG. 6, a mask 115, such as, for example, a photoresist including an optical planarization layer (OPL), is formed on the substrate 101 and on and around the remaining mandrel portions 105 and the silicon oxide portions 108. The mask 115 leaves exposed a mandrel portion 105 that is to be removed. Depending on design constraints, and the desired resulting structure of lines and/or spaces, any number of mandrel portions 105 can be left exposed to be removed. Since the mandrel material is different from the material of the silicon oxide portions 108 and can be selectively removed with respect to the silicon oxide portions 108, the mask 115 can leave exposed silicon oxide portions 108 which are adjacent the mandrel portion 105 that is to be removed. As shown by the phantom lines 117, the exposed mandrel portion 105 is removed using an etching process which is selective with respect to the material of the silicon oxide portions 108. In accordance with an embodiment of the present invention, if the mandrel material includes low Ge % SiGe, and the material of the silicon oxide portions 108 includes silicon oxide, then the mandrel portion 105 can be selectively etched using any suitable etch process, for example, gas phase hydrogen fluoride, a wet etch process containing a mix of ammonia and hydrogen peroxide, or a dry etch such as a plasma etch.

Figure 7:
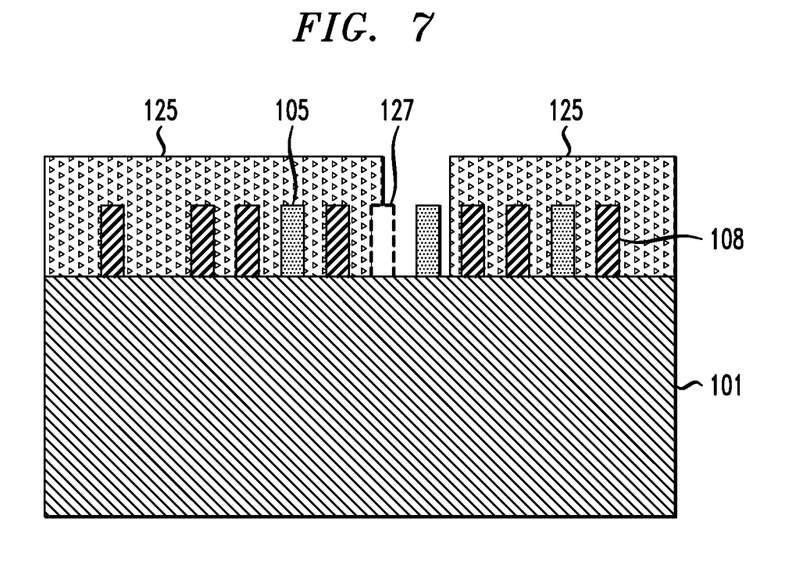
FIG. 7 is a cross-sectional view illustrating mask formation and selective removal of an exposed portion of an oxide in a method of manufacturing a semiconductor device, according to an exemplary embodiment of the present invention.

FIG. 7 is a cross-sectional view illustrating mask formation and selective removal of an exposed portion of an oxide in a method of manufacturing a semiconductor device, according to an exemplary embodiment of the present invention. Referring to FIG. 7, after the processing in FIG. 6, and removal of the mask 115, a mask 125, such as, for example, a photoresist including an optical planarization layer (OPL), is formed on the substrate 101 and on and around the remaining mandrel portions 105 and the silicon oxide portions 108. The mask 115 can be removed by, for example, oxygen plasma etch.

The mask 125 leaves exposed a silicon oxide portion 108 that is to be removed. Depending on design constraints, and the desired resulting structure of lines and/or spaces, any number of silicon oxide portions 108 can be left exposed to be removed. Since the material of the silicon oxide portions 108 is different from the mandrel material and can be selectively removed with respect to the mandrel material, the mask 125 can leave mandrel portions 105 which are adjacent the silicon oxide portion 108 that is to be removed. As shown by the phantom lines 127, the exposed silicon oxide portion 108 is removed using an etching process which is selective with respect to the mandrel material. In accordance with an embodiment of the present invention, if the material of the silicon oxide portions 108 includes silicon oxide and the mandrel material includes low Ge % SiGe, then the silicon oxide portion 108 can be selectively etched using, for example, a wet etch process including hydrofluoric acid (HF). Alternatively, silicon oxide can be removed by dry etch such as chemical oxide removal (COR) or a plasma etch.

Figure 8:
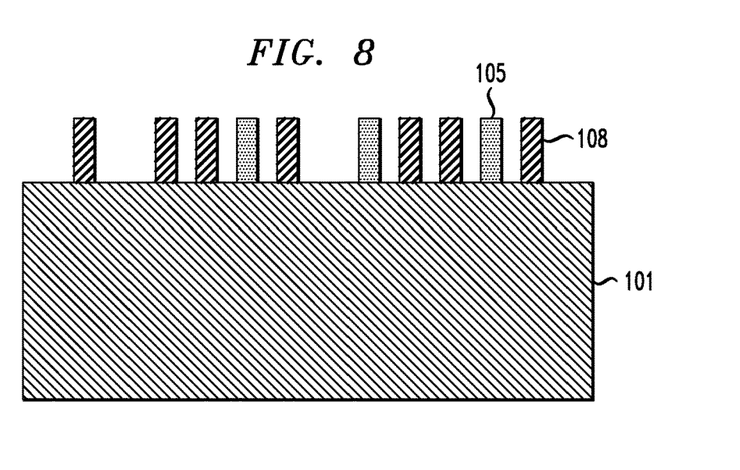
FIG. 8 is a cross-sectional view illustrating mask removal in a method of manufacturing a semiconductor device, according to an exemplary embodiment of the present invention.
Figure 9:
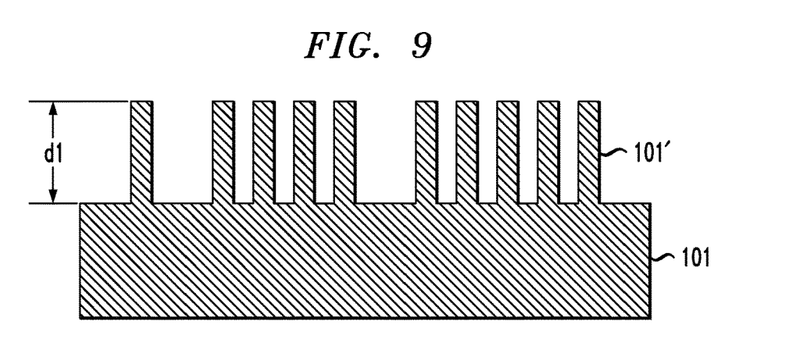
FIG. 9 is a cross-sectional view illustrating removal of exposed portions of the substrate not covered by the remaining portions of the mandrel material and oxide to form lines in a method of manufacturing a semiconductor device, according to an exemplary embodiment of the present invention.

FIG. 8 is a cross-sectional view illustrating mask removal, and FIG. 9 is a cross-sectional view illustrating removal of exposed portions of the substrate not covered by the remaining portions of the mandrel material and oxide to form lines in a method of manufacturing a semiconductor device, according to an exemplary embodiment of the present invention. Referring to FIGS. 8 and 9, the mask 125 is removed using, for example, oxygen plasma etch. Using the remaining mandrel portions 105 and silicon oxide portions 108 as masks, exposed portions of the substrate 101 not covered by the remaining mandrel portions 105 and silicon oxide portions 108 are removed to a certain depth d1 (depending on design) using a substrate etch. The substrate etch transfers the pattern of the remaining mandrel portions 105 and silicon oxide portions 108 to the substrate to form patterned substrate portions 101'. In accordance with an embodiment of the present invention, substrate 101 including a semiconductor material, such as, Si, SiGe, SiC, Si:C, SiGeC, SiGe:C, II-V compound semiconductor or other like semiconductor can be selectively etched with respect to the remaining mandrel portions 105 and silicon oxide portions 108 using, for example, a silicon RIE process, and substrate 101 including a dielectric material, such as, but not necessarily limited to, SiOCH can be selectively etched with respect to the remaining mandrel portions 105 and silicon oxide portions 108 using, for example, $CF_4$ or $N_2/H_2$ plasma.

In accordance with an embodiment of the present invention, if the substrate comprises SiGe, a hardmask layer (e.g., silicon nitride (SiN)) is inserted between the SiGe substrate and the mandrel portions. In other words, the hardmask layer can be deposited on top of the SiGe substrate prior to forming the SiGe mandrels. Instead of using remaining mandrel portions and silicon oxide portions to directly pattern the substrate, the remaining mandrel and silicon oxide portions can be used when etching the SiN hardmask layer as the mask layers to pattern the SiN hardmask. Once the SiN hardmask layer is patterned, the SiN hardmask layer is used to pattern a SiGe substrate.

As noted above, the processing forms lines 101' in a tight pitch structure (e.g., 20 nm to 60 nm between adjacent lines) without compromising the structure and/or integrity of adjacent lines 101'. Depending on the material of the substrate 101, and, therefore, the resulting material of the lines 101', the lines 101' can form, for example, semiconductor fins or other semiconductor structures, or isolation regions or other insulating structures at a close pitch with respect to each other.

Figure 10:
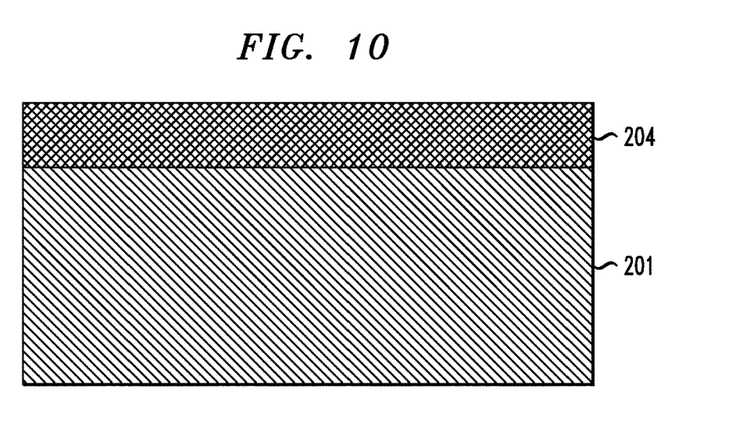
FIG. 10 is a cross-sectional view illustrating mandrel material deposition on a substrate in a method of manufacturing a semiconductor device, according to an exemplary embodiment of the present invention.
Figure 11:
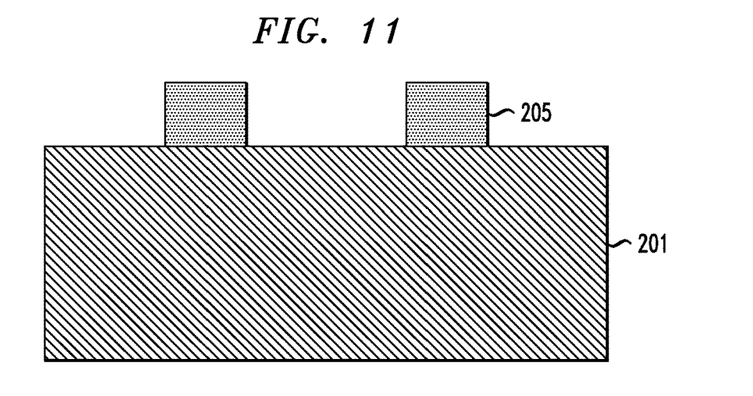
FIG. 11 is a cross-sectional view illustrating mandrel patterning on the substrate in a method of manufacturing a semiconductor device, according to an exemplary embodiment of the present invention.
Figure 12:
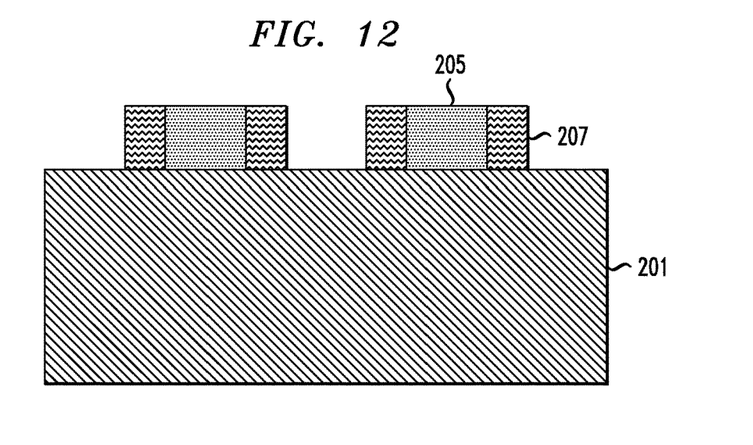
FIG. 12 is a cross-sectional view illustrating spacer formation in a method of manufacturing a semiconductor device, according to an exemplary embodiment of the present invention.

FIGS. 10-12 are cross-sectional views illustrating mandrel material deposition, mandrel patterning and spacer formation on a substrate in a method of manufacturing a semiconductor device, according to an exemplary embodiment of the present invention. Referring to FIGS. 10-12, a mandrel material layer 204 comprising amorphous silicon germanium (a-SiGe) is deposited on a substrate 201. The mandrel material layer 204 can be deposited using deposition techniques, such as, for example, CVD, PECVD, RFCVD, PVD, ALD, MLD, MBD, PLD, LSMCD, and/or sputtering. Alternative mandrel materials can include, but are not necessarily limited to, polycrystalline silicon germanium, polycrystalline germanium, and amorphous germanium.

Referring to FIG. 11, a plurality of mandrels 205 are patterned on the substrate 201. As noted above in connection with FIG. 2, the mandrel patterning can be done by various patterning techniques, including, but not necessarily limited to, lithography patterning followed by directional etching and/or a sidewall image transfer (SIT) process, for example. After the mandrel formation, a conformal film can be deposited and then followed by an etchback process (e.g., RIE). As shown in FIG. 12, the conformal film will form spacers 207 at both sides of each mandrel 205. The spacer material can include, but is not necessarily limited to, germanium dioxide ($GeO_2$), which can be deposited by LPCVD, PECVD, SACVD, RTCVD, in-situ radical assisted deposition, HTO deposition, LTO deposition, ozone/TEOS deposition, and/or LRPCVD. A height of the mandrels 205 and corresponding spacers 207 can be in the range of, but is not necessarily limited to, 30 nm to 100 nm. A horizontal width (thickness) of the spacers 207 can be in the range of, but is not necessarily limited to, 10 nm to 50 nm.

As noted above in connection with the substrate 101, depending on the application, the substrate 201 can include semiconductor or dielectric materials, and can include other device structures (not shown) such as transistors, isolation structures (such as shallow trench isolations), contacts, conducting wires, etc.

Figure 13:
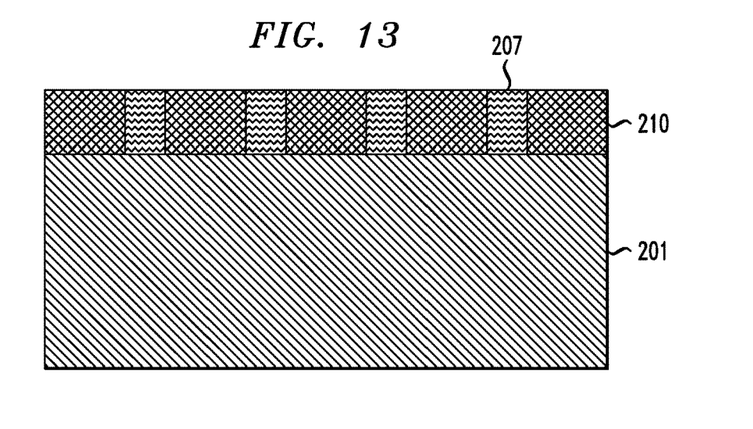
FIG. 13 is a cross-sectional view illustrating mandrel material deposition to fill in vacant areas on the substrate and planarization in a method of manufacturing a semiconductor device, according to an exemplary embodiment of the present invention.

FIG. 13 is a cross-sectional view illustrating mandrel material deposition to fill in vacant areas on the substrate and planarization in a method of manufacturing a semiconductor device, according to an exemplary embodiment of the present invention. Referring to FIG. 13, the mandrel material, such as a-SiGe, is deposited on the structure from FIG. 12 to create a layer 210 in which vacant areas on the substrate 201 have been filled in. The deposited layer 210 is planarized to the top surface of the spacers 207 and the top surface of the mandrels 205 to result in the structure shown in FIG. 13. The mandrel material can be deposited using deposition techniques, including, but not limited to, CVD, LPCVD, PECVD, LPCVD, RFCVD, PVD, ALD, MLD, MBD, PLD, LSMCD, spin-on, and/or sputtering, and the planarization can be performed using, for example, chemical mechanical planarization (CMP).

Figure 14:
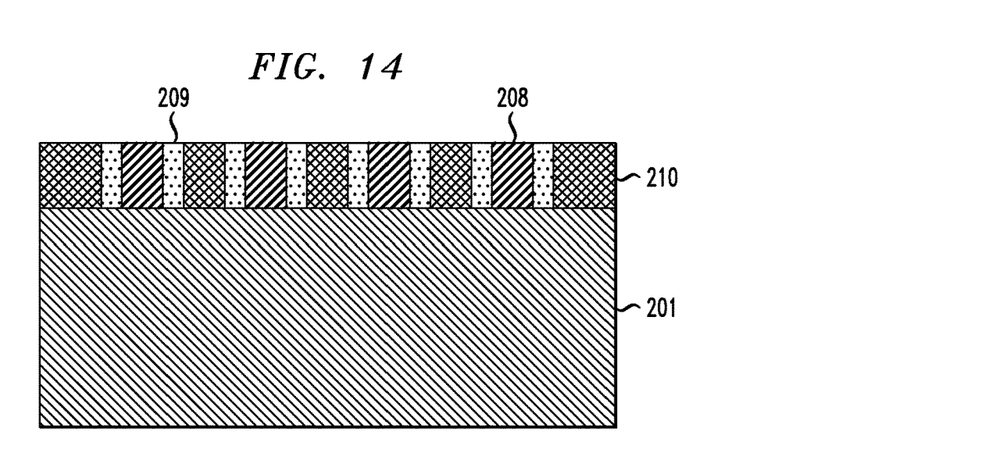
FIG. 14 is a cross-sectional view illustrating a result of an annealing process in a method of manufacturing a semiconductor device, according to an exemplary embodiment of the present invention.

FIG. 14 is a cross-sectional view illustrating a result of an annealing process in a method of manufacturing a semiconductor device, according to an exemplary embodiment of the present invention. Referring to FIG. 14, a low temperature annealing process is performed to convert the germanium dioxide ($GeO_2$) spacers 207 and convert portions of the a-SiGe mandrels 205 into silicon oxide (e.g., $SiO_2$ and $SiO_x$) and high Ge % SiGe, respectively. According to an embodiment of the present invention, similar to what is described in connection with FIG. 4, during the low temperature annealing process, the annealing conditions cause the Si in the a-SiGe mandrel 205 to bond with the oxygen in the $GeO_2$ spacers 207 to form silicon oxide portions 208. The Si in the a-SiGe mandrel does not bond with the Ge in the $GeO_2$ spacers 207. As a result, the Ge from the $GeO_2$ spacers 207 is driven into the outer portions of the mandrels 205 and the Si from the outer portions of the mandrels 205 is driven out of the mandrel portions 205 to bond with the oxygen, which forms the high Ge % SiGe portions 209 between the remaining mandrel portions 205 and the silicon oxide portions 208. The resulting Ge concentration in the high Ge % SiGe portions 209 is higher than the Ge concentration in the remaining mandrel portions 205 (also referred to herein as low Ge % SiGe portions). In accordance with an embodiment of the present invention, the percentage (i.e., concentration) of Ge in the high Ge % SiGe portions 209 is in the range of 30 atomic % to 90 atomic %, and the percentage (i.e., concentration) of Ge in the low Ge % SiGe portions 205 is in the range of 15 atomic % to 50 atomic %. The annealing conditions for the embodiment described in connection with FIG. 14 can be the same or similar to those described in connection with FIG. 4.

Figure 15:
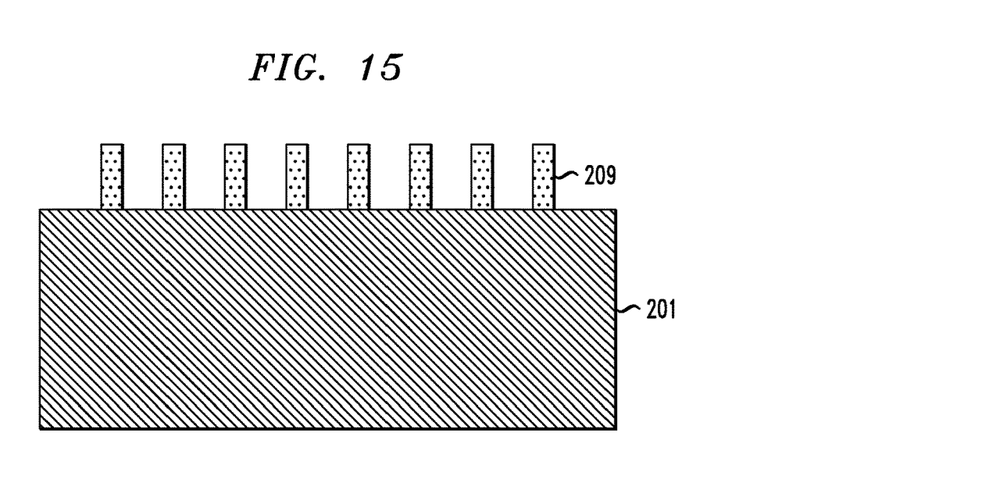
FIG. 15 is a cross-sectional view illustrating selective removal of mandrel material and oxide in a method of manufacturing a semiconductor device, according to an exemplary embodiment of the present invention.

FIG. 15 is a cross-sectional view illustrating selective removal of mandrel material and oxide in a method of manufacturing a semiconductor device, according to an exemplary embodiment of the present invention. Referring to FIG. 15, the remaining mandrel portions 205 (i.e., low Ge % SiGe portions) and the silicon oxide portions 208 are selectively removed with respect to the high Ge % SiGe portions 209. An etching process that selectively removes the remaining mandrel portions 205 and the silicon oxide portions 208 with respect to the high Ge % SiGe portions 209 is performed. The selective removal performed down to the substrate 201, and can be performed using, for example, a silicon oxide etch selective to high Ge % SiGe, such as a wet etch process including hydrofluoric acid (HF). Alternatively, silicon oxide can be removed by a dry etch such as chemical oxide removal (COR) or plasma etch. A low Ge % SiGe etch selective to high Ge % SiGe includes, for example, a wet etch containing ammonia.

Figure 16:
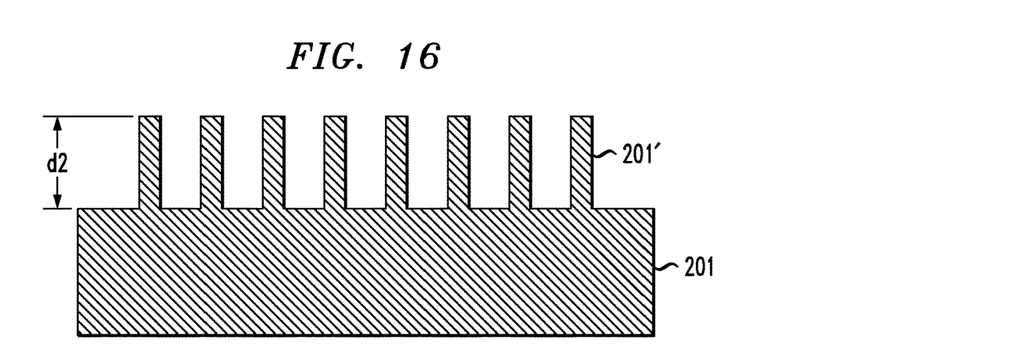
FIG. 16 is a cross-sectional view illustrating removal of exposed portions of the substrate not covered by the remaining portions of high germanium (Ge) percentage (%) silicon germanium (SiGe) to form lines in a method of manufacturing a semiconductor device, according to an exemplary embodiment of the present invention.

FIG. 16 is a cross-sectional view illustrating removal of exposed portions of the substrate not covered by the remaining portions of high germanium (Ge) percentage (%) silicon germanium (SiGe) to form lines in a method of manufacturing a semiconductor device, according to an exemplary embodiment of the present invention. Referring to FIG. 16, using the remaining high Ge % SiGe portions 209 as masks, exposed portions of the substrate 201 not covered by the remaining high Ge % SiGe portions 209 are removed to a certain depth d2 (depending on design) using a substrate etch. The substrate etch transfers the pattern of the remaining high Ge % SiGe portions 209 to the substrate to form patterned substrate portions 201'. In accordance with an embodiment of the present invention, substrate 201 including a semiconductor material, such as, Si, SiGe, SiC, Si:C, SiGeC, SiGe:C, II-V compound semiconductor or other like semiconductor, can be selectively etched with respect to the remaining high Ge % SiGe portions 209 using, for example, a silicon RIE process, and substrate 201 including a dielectric material, such as, but not necessarily limited to, SiOCH can be selectively etched with respect to the remaining high Ge % SiGe portions 209 using, for example, $CF_4$ or $N_2/H_2$ plasma.

As noted above, the processing forms lines 201' in a tight pitch structure (e.g., 20 nm to 60 nm between adjacent lines) without compromising the structure and/or integrity of adjacent lines 201'. Depending on the material of the substrate 201, and, therefore, the resulting material of the lines 201', the lines 201' can form, for example, semiconductor fins or other semiconductor structures, or isolation regions or other insulating structures at a close pitch with respect to each other. As noted above, if the substrate comprises SiGe, a hardmask layer (e.g., silicon nitride (SiN)) can be inserted between the SiGe substrate and the mandrel portions.

Figure 17:
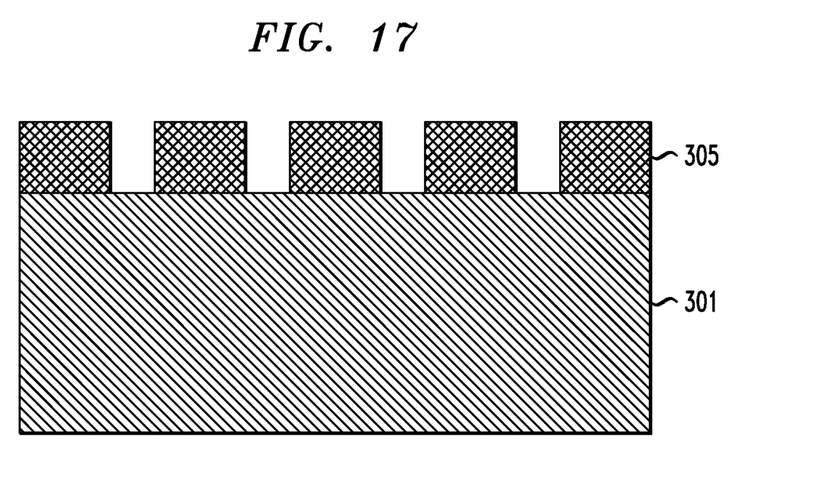
FIG. 17 is a cross-sectional view illustrating mandrel patterning on the substrate in a method of manufacturing a semiconductor device, according to an exemplary embodiment of the present invention.

FIG. 17 is a cross-sectional view illustrating mandrel patterning on the substrate in a method of manufacturing a semiconductor device, according to an exemplary embodiment of the present invention. Referring to FIG. 17, after deposition of a mandrel material layer comprising, for example, amorphous silicon germanium (a-SiGe) a plurality of mandrels 305 are patterned on the substrate 301. As noted above in connection with FIGS. 2 and 11, the mandrel patterning can be done by various patterning techniques, including, but not necessarily limited to, lithography patterning followed by directional etching and/or a sidewall image transfer (SIT) process, for example. Alternative mandrel materials can include, but are not necessarily limited to, polycrystalline silicon germanium, polycrystalline germanium, and amorphous germanium. A height of the mandrels 305 can be in the range of, but is not necessarily limited to, 30 nm to 100 nm.

As noted above in connection with the substrates 101 and 201, depending on the application, the substrate 301 can include semiconductor or dielectric materials, and can include other device structures (not shown) such as transistors, isolation structures (such as shallow trench isolations), contacts, conducting wires, etc.

Figure 18:
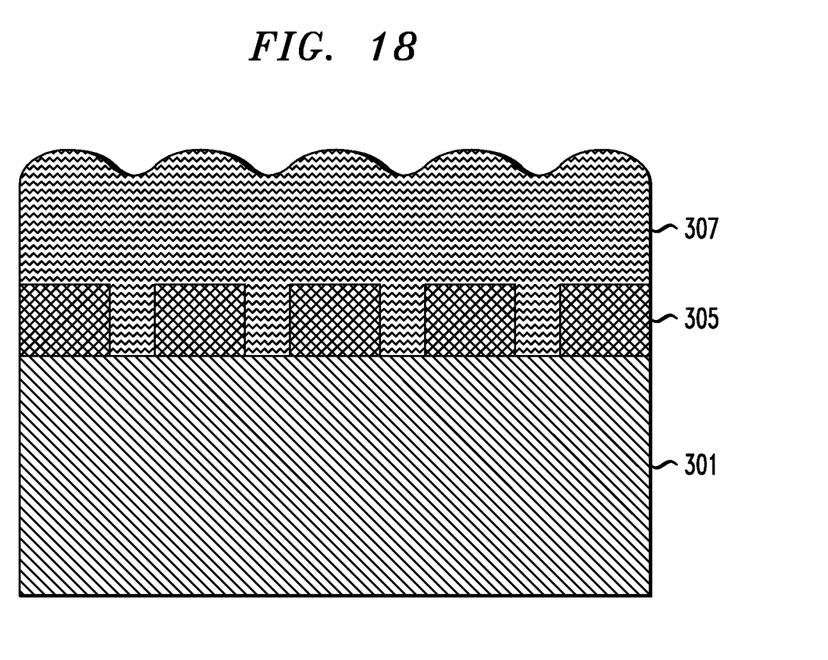
FIG. 18 is a cross-sectional view illustrating dielectric layer deposition in a method of manufacturing a semiconductor device, according to an exemplary embodiment of the present invention.

FIG. 18 is a cross-sectional view illustrating dielectric layer deposition in a method of manufacturing a semiconductor device, according to an exemplary embodiment of the present invention. Referring to FIG. 18, a dielectric layer 307 is deposited over the structure in FIG. 17, using deposition techniques, such as, for example, CVD, LPCVD, PECVD, LPCVD, RFCVD, PVD, ALD, MLD, MBD, PLD, LSMCD, spin-on, and/or sputtering. In accordance with an embodiment of the present invention, the layer 307 includes $GeO_2$, and a planarization/polishing process is not performed on the deposited layer 307. A height of the dielectric layer 307 can be in the range of, but is not necessarily limited to, 100 nm-150 nm.

Figure 19:
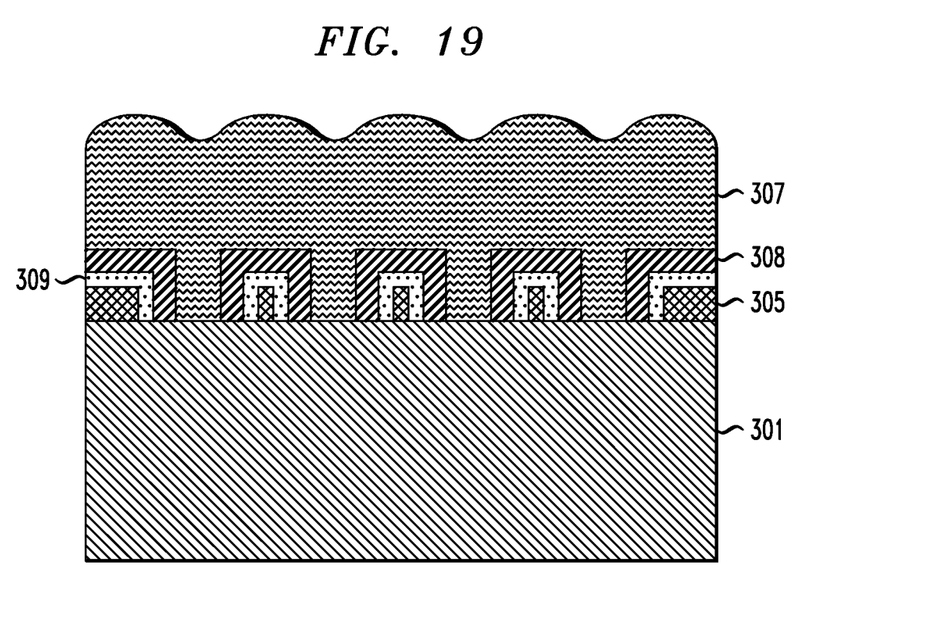
FIG. 19 is a cross-sectional view illustrating a result of an annealing process in a method of manufacturing a semiconductor device, according to an exemplary embodiment of the present invention.

FIG. 19 is a cross-sectional view illustrating a result of an annealing process in a method of manufacturing a semiconductor device, according to an exemplary embodiment of the present invention. Referring to FIG. 19, an annealing process is performed to convert portions of the $GeO_2$ layer 307 and convert portions of the a-SiGe mandrels 305 into silicon oxide (e.g., $SiO_2$ or $SiO_x$) and high Ge % SiGe, respectively. According to an embodiment of the present invention, similar to what is described in connection with FIG. 4, during the annealing process, the annealing conditions cause the Si in the a-SiGe mandrel 305 to bond with the oxygen in the portions of the $GeO_2$ layer 307 on side and top surfaces of the mandrels 305 to form silicon oxide portions 308 on top and side surfaces of the mandrels 305. The Si in the a-SiGe mandrel does not bond with the Ge in the $GeO_2$ layer 307. As a result, the Ge from the $GeO_2$ layer 307 is driven into the outer portions of the mandrels 305 and the Si from the outer portions of the mandrels 305 is driven out of the mandrel portions 305 to bond with the oxygen, which forms the high Ge % SiGe portions 309 on the top and side surfaces of the remaining mandrel portions 305 between the remaining mandrel portions 305 and the silicon oxide portions 308. The resulting Ge concentration in the high Ge % SiGe portions 309 is higher than the Ge concentration in the remaining mandrel portions 305 (also referred to herein as low Ge % SiGe portions). In accordance with an embodiment of the present invention, the percentage (i.e., concentration) of Ge in the high Ge % SiGe portions 309 is in the range of 50 atomic % to 90 atomic %, and the percentage (i.e., concentration) of Ge in the low Ge % SiGe portions 305 is in the range of 15 atomic % to 30 atomic %.

In accordance with an embodiment of the present invention, the annealing is a spike anneal carried out in a nitrogen (N$_2$) ambient at less than 500° C. In accordance with embodiments of the present invention, the annealing can be performed at a temperature range of 350° C.-700° C., in an environment including nitrogen, argon, xenon, helium, hydrogen, or any suitable combination of those gases, for a time period 1 millisecond to 30 minutes. The anneal can be done by rapid thermal annealing (RTP), furnace annealing, flash annealing, laser annealing, spike annealing, or any suitable combination of those techniques.

In accordance with an embodiment of the present invention, the annealing may be carried out for a variable period of time. In one example, the annealing process is carried out for a time period from about 0.5 seconds to 2 seconds, depending on temperature and germanium concentration in the SiGe mandrel. The annealing process may be carried out at a single targeted temperature, or at various ramp and soak cycles using various ramp rates and soak times.

Figure 20:
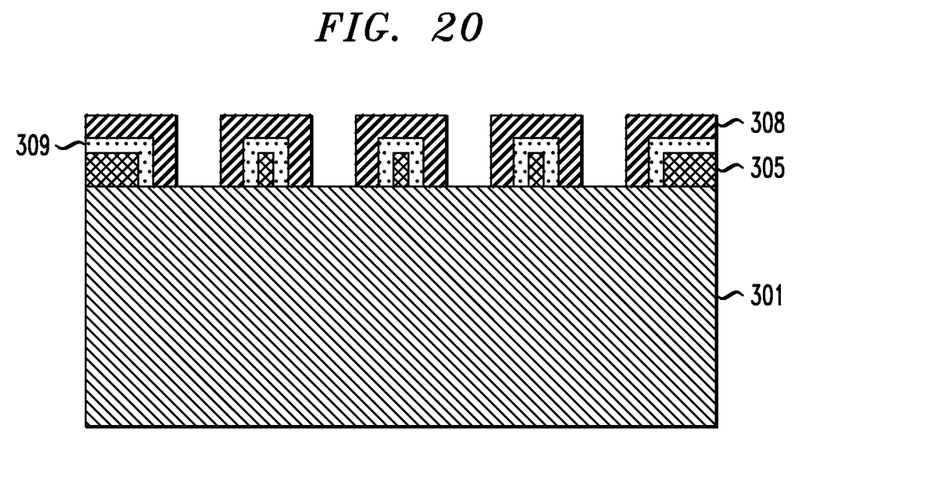
FIG. 20 is a cross-sectional view illustrating removal of unreacted portions of the dielectric layer in a method of manufacturing a semiconductor device, according to an exemplary embodiment of the present invention.

FIG. 20 is a cross-sectional view illustrating removal of unreacted portions of the dielectric layer in a method of manufacturing a semiconductor device, according to an exemplary embodiment of the present invention. Referring to FIG. 20, unreacted portions of the dielectric layer (e.g., GeO$_2$ that has not been converted to silicon oxide) after the annealing process are selectively removed with respect to the silicon oxide portions 308 covering the mandrel and the high Ge % SiGe portions 305, 309 using, for example, deionized water (DIW).

Figure 21:
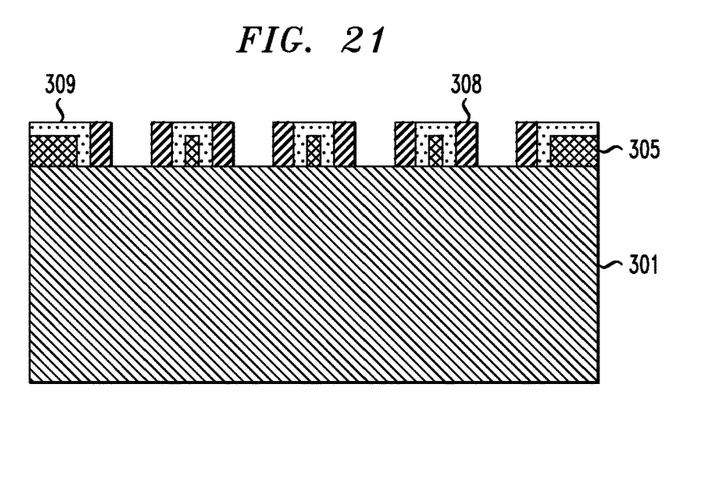
FIG. 21 is a cross-sectional view illustrating anisotropic removal of horizontal oxide portions in a method of manufacturing a semiconductor device, according to an exemplary embodiment of the present invention.

FIG. 21 is a cross-sectional view illustrating anisotropic removal of horizontal oxide portions in a method of manufacturing a semiconductor device, according to an exemplary embodiment of the present invention. Referring to FIG. 21, an anisotropic etching process (e.g., ME) is performed to directionally remove the horizontal parts of the silicon oxide portions 308. The etching can be performed using, for example, an oxide ME process to remove the horizontal parts of the silicon oxide portions 308.

Figure 22:
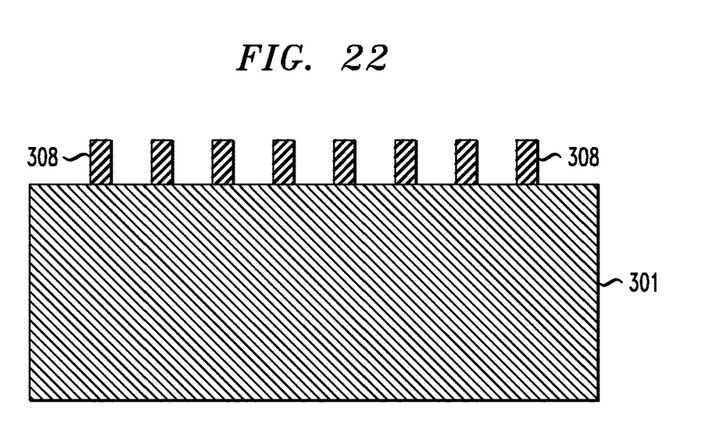
FIG. 22 is a cross-sectional view illustrating selective removal of silicon germanium (SiGe) in a method of manufacturing a semiconductor device, according to an exemplary embodiment of the present invention.

FIG. 22 is a cross-sectional view illustrating selective removal of silicon germanium (SiGe) in a method of manufacturing a semiconductor device, according to an exemplary embodiment of the present invention. Referring to FIG. 22, the SiGe portions 305 and 309 (e.g., low and high Ge % SiGe portions) are selectively removed with respect to the silicon oxide portions 308. The SiGe portions 305 and 309 are removed using an etching process which is selective with respect to the material of the silicon oxide portions 308. In accordance with an embodiment of the present invention, if the SiGe portions 305 and 309 include low and high Ge % SiGe, and the material of the silicon oxide portions 308 includes silicon oxide, then the SiGe portions 305 and 309 can be selectively etched using any suitable etch process, for example, gas phase hydrogen fluoride, a wet etch process containing a mix of ammonia and hydrogen peroxide, or a dry etch such as a plasma etch.

Figure 23:
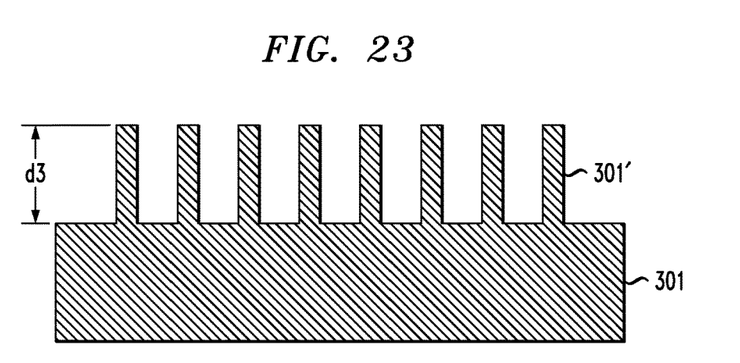
FIG. 23 is a cross-sectional view illustrating removal of exposed portions of the substrate not covered by the remaining portions of oxide to form lines in a method of manufacturing a semiconductor device, according to an exemplary embodiment of the present invention.

FIG. 23 is a cross-sectional view illustrating removal of exposed portions of the substrate not covered by the remaining portions of oxide to form lines in a method of manufacturing a semiconductor device, according to an exemplary embodiment of the present invention. Referring to FIG. 23, using the remaining silicon oxide portions 308 as masks, exposed portions of the substrate 301 not covered by the remaining silicon oxide portions 308 are removed to a certain depth d3 (depending on design) using a substrate etch. The substrate etch transfers the pattern of the remaining silicon oxide portions 308 to the substrate to form patterned substrate portions 301'. In accordance with an embodiment of the present invention, substrate 301 including a semiconductor material, such as, Si, SiGe, SiC, Si:C, SiGeC, SiGe:C, III-V, II-V compound semiconductor or other like semiconductor, can be selectively etched with respect to the remaining silicon oxide portions 308 using, for example, a silicon RIE process, and substrate 301 including a dielectric material, such as, but not necessarily limited to, SiOCH can be selectively etched with respect to the silicon oxide portions 308 using, for example, CF$_4$ or N$_2$/H$_2$ plasma.

As noted above, the processing forms lines 301' in a tight pitch structure (e.g., 20 nm to 60 nm between adjacent lines) without compromising the structure and/or integrity of adjacent lines 301'. Depending on the material of the substrate 301, and, therefore, the resulting material of the lines 301', the lines 301' can form, for example, semiconductor fins or other semiconductor structures, or isolation regions or other insulating structures at a close pitch with respect to each other.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a plurality of mandrels on a substrate, wherein the plurality of mandrels comprise silicon germanium (SiGe) having a first percentage of germanium;
    forming a plurality of dielectric portions on the substrate on sides of the plurality of mandrels;
    performing an annealing to convert a portion of each of the plurality of mandrels into respective portions comprising SiGe having a second percentage of germanium higher than the first percentage of germanium, and to convert at least a portion of each of the plurality of dielectric portions into respective silicon oxide portions;
    removing from the substrate at least one of:
        one or more unconverted portions of the plurality of mandrels comprising SiGe having the first percentage of germanium;
        one or more of the converted portions of the plurality of mandrels comprising SiGe having the second percentage of germanium; and
        one or more of the silicon oxide portions; and
    transferring a pattern to the substrate to form a plurality of patterned substrate portions, wherein the pattern includes at least one of the unconverted portions of the plurality of mandrels, the converted portions of the plurality of mandrels, and the silicon oxide portions remaining after the removing;
    wherein removing one or more of the converted portions of the plurality of mandrels comprises selectively removing each of the converted portions of the plurality of mandrels from the substrate with respect to the unconverted portions of the plurality of mandrels and the silicon oxide portions.

2. The method according to claim 1, wherein the plurality of dielectric portions comprise germanium dioxide (GeO$_2$).

3. The method according to claim 1, wherein the annealing is performed at a temperature of 400° C.-700° C.

4. The method according to claim 1, wherein the annealing is performed in a nitrogen (N$_2$) ambient at less than 500° C.

5. The method according to claim 1, further comprising forming a mask on the substrate, wherein the mask leaves exposed at least one of one or more of the unconverted portions of the plurality of mandrels and one or more of the silicon oxide portions.

6. The method according to claim 5, wherein removing one or more of the unconverted portions of the plurality of mandrels comprises removing the one or more of the unconverted portions of the plurality of mandrels left exposed by the mask.

7. The method according to claim 5, wherein removing one or more of the silicon oxide portions comprises removing the one or more of the silicon oxide portions left exposed by the mask.

8. The method according to claim 1, further comprising depositing a mandrel material on the substrate prior to the annealing, wherein the mandrel material fills in vacant areas between adjacent mandrels of the plurality of mandrels.

9. The method according to claim 1, wherein the plurality of dielectric portions comprise a plurality of spacers formed on the sides of the plurality of mandrels.

10. The method according to claim 1, wherein the plurality of dielectric portions are part of a dielectric layer formed on the substrate and on top surfaces of the plurality of mandrels.

11. The method according to claim 10, wherein the annealing converts a portion of the dielectric layer formed on the top surfaces of the plurality of mandrels into additional silicon oxide portions.

12. A method for manufacturing a semiconductor device, comprising:
   forming a plurality of mandrels on a substrate, wherein the plurality of mandrels comprise silicon germanium (SiGe) having a first percentage of germanium;
   forming a plurality of dielectric portions on the substrate on sides of the plurality of mandrels;
   performing an annealing to convert a portion of each of the plurality of mandrels into respective portions comprising SiGe having a second percentage of germanium higher than the first percentage of germanium, and to convert at least a portion of each of the plurality of dielectric portions into respective silicon oxide portions;
   removing from the substrate at least one of:
      one or more unconverted portions of the plurality of mandrels comprising SiGe having the first percentage of germanium;
      one or more of the converted portions of the plurality of mandrels comprising SiGe having the second percentage of germanium; and
      one or more of the silicon oxide portions; and
   transferring a pattern to the substrate to form a plurality of patterned substrate portions, wherein the pattern includes at least one of the unconverted portions of the plurality of mandrels, the converted portions of the plurality of mandrels, and the silicon oxide portions remaining after the removing;
   wherein each of the unconverted portions of the plurality of mandrels and each of the silicon oxide portions are removed from the substrate so that the plurality of patterned substrate portions correspond to the converted portions of the plurality of mandrels remaining after the removing and not to the unconverted portions of the plurality of mandrels and the silicon oxide portions.

13. A method for manufacturing a semiconductor device, comprising:
   forming a plurality of mandrels on a substrate, wherein the plurality of mandrels comprise silicon germanium (SiGe) having a first percentage of germanium;
   forming a plurality of dielectric portions on the substrate on sides of the plurality of mandrels;
   performing an annealing to convert a portion of each of the plurality of mandrels into respective portions comprising SiGe having a second percentage of germanium higher than the first percentage of germanium, and to convert at least a portion of each of the plurality of dielectric portions into respective silicon oxide portions;
   removing from the substrate at least one of:
      one or more unconverted portions of the plurality of mandrels comprising SiGe having the first percentage of germanium;
      one or more of the converted portions of the plurality of mandrels comprising SiGe having the second percentage of germanium; and
      one or more of the silicon oxide portions; and
   transferring a pattern to the substrate to form a plurality of patterned substrate portions, wherein the pattern includes at least one of the unconverted portions of the plurality of mandrels, the converted portions of the plurality of mandrels, and the silicon oxide portions remaining after the removing;
   wherein each of the unconverted portions of the plurality of mandrels and each of the converted portions of the plurality of mandrels are removed from the substrate so that the plurality of patterned substrate portions correspond to the silicon oxide portions remaining after the removing and not to the unconverted and converted portions of the plurality of mandrels.

14. A method for manufacturing a semiconductor device, comprising:
   forming a plurality of mandrels on a substrate, wherein the plurality of mandrels comprise silicon germanium (SiGe) having a first percentage of germanium;
   forming a plurality of dielectric portions on the substrate on sides of the plurality of mandrels;
   performing an annealing to convert a portion of each of the plurality of mandrels into respective portions comprising SiGe having a second percentage of germanium higher than the first percentage of germanium, and to convert at least a portion of each of the plurality of dielectric portions into respective silicon oxide portions;
   removing from the substrate at least one of:
      one or more unconverted portions of the plurality of mandrels comprising SiGe having the first percentage of germanium;
      one or more of the converted portions of the plurality of mandrels comprising SiGe having the second percentage of germanium; and
      one or more of the silicon oxide portions;
   transferring a pattern to the substrate to form a plurality of patterned substrate portions, wherein the pattern includes at least one of the unconverted portions of the plurality of mandrels, the converted portions of the plurality of mandrels, and the silicon oxide portions remaining after the removing;
   wherein the plurality of dielectric portions are part of a dielectric layer formed on the substrate and on top surfaces of the plurality of mandrels; and
   wherein the annealing converts a portion of the dielectric layer formed on the top surfaces of the plurality of mandrels into additional silicon oxide portions; and removing unconverted portions of the dielectric layer and of the plurality of dielectric portions.

15. The method according to claim 14, further comprising removing the additional silicon oxide portions.

16. A method for manufacturing a semiconductor device, comprising:
   forming a plurality of amorphous silicon germanium (a-SiGe) structures having a first percentage of germanium on a substrate;
   forming a plurality of spacers on the substrate on sides of the plurality of a-SiGe structures;
   performing an annealing to convert a portion of each of the plurality of a-SiGe structures into respective portions comprising a-SiGe having a second percentage of germanium higher than the first percentage of germanium, and to convert each of the plurality of spacers into respective silicon oxide portions;
   removing from the substrate at least one of:
      one or more unconverted portions of the plurality of a-SiGe structures having the first percentage of germanium;
      one or more of the converted portions of the plurality of a-SiGe structures having the second percentage of germanium; and
      one or more of the silicon oxide portions; and
   transferring a pattern to the substrate to form a plurality of patterned substrate portions, wherein the pattern includes at least one of the unconverted portions of the plurality of a-SiGe structures, the converted portions of the plurality of a-SiGe structures, and the silicon oxide portions remaining after the removing.

* * * * *